(12) United States Patent
Cheng et al.

(10) Patent No.: US 10,340,876 B2
(45) Date of Patent: Jul. 2, 2019

(54) TUNABLE AND INTEGRATED IMPEDANCE MATCHING AND FILTER CIRCUIT

(71) Applicant: pSemi Corporation, San Diego, CA (US)

(72) Inventors: Chih-Chieh Cheng, Poway, CA (US); Tero Tapio Ranta, San Diego, CA (US); Richard Bryon Whatley, Carlsbad, CA (US); Vikram Sekar, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 83 days.

(21) Appl. No.: 15/048,744

(22) Filed: Feb. 19, 2016

(65) Prior Publication Data
US 2017/0026021 A1    Jan. 26, 2017

Related U.S. Application Data

(63) Continuation-in-part of application No. 14/690,212, filed on Apr. 17, 2015, now Pat. No. 9,667,217.

(51) Int. Cl.
| | |
|---|---|
| H03H 7/38 | (2006.01) |
| H03H 7/01 | (2006.01) |
| H01L 23/64 | (2006.01) |
| H01L 21/70 | (2006.01) |
| H01F 17/00 | (2006.01) |

(52) U.S. Cl.
CPC .......... *H03H 7/38* (2013.01); *H01L 21/702* (2013.01); *H01L 23/642* (2013.01); *H01L 23/645* (2013.01); *H03H 7/0115* (2013.01); *H03H 7/0153* (2013.01); *H03H 7/1775* (2013.01); *H01F 17/0006* (2013.01); *H03H 2007/386* (2013.01)

(58) Field of Classification Search
CPC ........ H03H 7/38; H01L 21/702; H01L 23/642
USPC ............................................................ 333/32
See application file for complete search history.

(56) References Cited

U.S. PATENT DOCUMENTS

| | | | | |
|---|---|---|---|---|
| 5,187,457 | A | * | 2/1993 | Chawla ............. H01J 37/32082 333/170 |
| 5,656,849 | A |   | 8/1997 | Burghartz et al. |
| 6,737,932 | B2 | * | 5/2004 | Killen ...................... H01P 5/02 333/124 |
| 8,811,911 | B2 |   | 8/2014 | Su et al. |

(Continued)

OTHER PUBLICATIONS

Outten, Samuel S., Final Office Action received from the USPTO dated Dec. 6, 2016 for U.S. Appl. No. 14/690,212, 12 pgs.

(Continued)

*Primary Examiner* — Stephen E. Jones
*Assistant Examiner* — Samuel S Outten
(74) *Attorney, Agent, or Firm* — Jaquez Land Greenhaus LLP; John Land, Esq.

(57) ABSTRACT

A high performance integrated tunable impedance matching network with coupled merged inductors. Embodiments include a combination of merged multiport constructively coupled spiral inductors and tunable capacitors configured to reduce insertion losses, circuit size, and optimization time while maintaining a high Q factor for the coupled spiral inductors. Some embodiments integrate one or more filter circuits with a tunable impedance matching network, useful in conjunction with such applications as radio frequency power amplifiers.

38 Claims, 9 Drawing Sheets

(56) References Cited

U.S. PATENT DOCUMENTS

| | | | |
|---|---|---|---|
| 9,066,391 B1* | 6/2015 | Heyfitch | H01P 5/028 |
| 9,667,217 B2 | 5/2017 | Cheng et al. | |
| 2005/0168152 A1* | 8/2005 | Blackburn | H01J 37/32082 |
| | | | 315/111.21 |
| 2005/0206470 A1 | 9/2005 | Lin et al. | |
| 2010/0194487 A1* | 8/2010 | Fukuda | H03F 1/56 |
| | | | 333/32 |
| 2011/0002080 A1 | 1/2011 | Ranta | |
| 2011/0175687 A1* | 7/2011 | Morris, III | H03H 7/383 |
| | | | 333/32 |
| 2013/0207872 A1* | 8/2013 | Bakalski | H04B 1/0458 |
| | | | 343/860 |
| 2015/0097637 A1 | 4/2015 | Pye et al. | |

OTHER PUBLICATIONS

Outten, Samuel, Notice of Allowance received from the USPTO dated Mar. 28, 2017 for U.S. Appl. No. 14/690,212, 9 pgs.

Ito, et al., "Characterization of On-Chip Mutliport Inductors for Small-Area RF Circuits", IEEE Transactions on Circuits and Systems-I: Regular Papers, vol. 56, No. 8, Aug. 2009, pp. 1590-1597.

Outten, Samuel S., Office Action received from the USPTO dated Jun. 23, 2016 for U.S. Appl. No. 14/690,212, 14 pgs.

Cheng, et al., "High Performance Integrated Tunable Impedance Matching Network with Coupled Merged Inductors", patent application filed in the USPTO filed Apr. 17, 2015, U.S. Appl. No. 14/690,212, 25 pgs.

Outten, Samuel, Advisory Action received from the USPTO dated Feb. 10, 2017 for U.S. Appl. No. 14/690,212, 5 pgs.

* cited by examiner

FIG. 6A
Mid-Band

FIG. 6B
Low-Band

FIG. 10B

TUNABLE AND INTEGRATED IMPEDANCE MATCHING AND FILTER CIRCUIT

CROSS-REFERENCE TO RELATED APPLICATIONS—CLAIM OF PRIORITY

This application is a Continuation-in-part (CIP) of commonly assigned and co-pending U.S. Utility application Ser. No. 14/690,212, filed Apr. 17, 2015 and entitled "High Performance Integrated Tunable Impedance Matching Network with Coupled Merged Inductors", the contents of which are hereby incorporated by reference as if set forth in full.

BACKGROUND (1) Technical Field

This invention generally relates to electronic circuitry, and more specifically to tunable integrated impedance matching and filtering networks for use in electronic radio frequency circuits, and in particular with radio frequency power amplifiers.

(2) Background

Radio frequency (RF) communication systems typically include "RF front-end" (RFFE) circuitry, which is a generic term for all of the circuitry between a radio antenna up to and including the mixer stage of a radio. Impedance matching (IM) networks are an essential building block in RFFE circuits in order to match the internal impedance of an RFFE (e.g., 2-3 ohms) to the nominal impedance value (typically 50 ohms) of the characteristic impedance of common RF systems.

Figure 1:
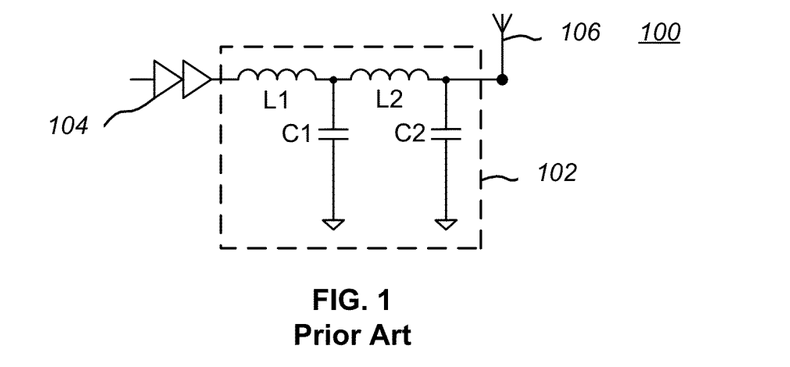
FIG. 1 is a schematic diagram of an RF front end including one type of prior art impedance matching network.

FIG. 1 is a schematic diagram of an RF front end 100 including one type of prior art impedance matching network 102. The IM network 102 is shown connected to a power amplifier 104 and an antenna 106. The illustrated IM network 102 includes two series-connected stages of inductors L1, L2, and corresponding shunt capacitors C1, C2 connected to circuit ground as shown. In other embodiments, more stages of inductors and shunt capacitors may be used. The values selected for L1, L2, C1, and C2 are design and system dependent, but the function and design of such IM networks 102 is well known in the art.

Figure 2:
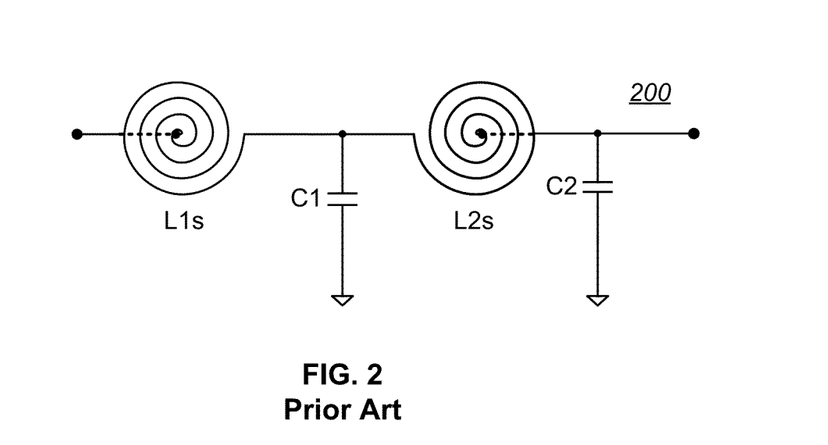
FIG. 2 is a schematic diagram showing one type of prior art impedance matching network having spiral inductors L1s, L2s shown in place of the inductors L1, L2 of FIG. 1.

When implemented with integrated circuit technology, the inductors used in typical RFFE's are commonly formed as 2-port spirals; examples of such spiral inductors are shown in U.S. Pat. No. 5,656,849. FIG. 2 is a schematic diagram showing one type of prior art impedance matching network 200 having spiral inductors L1s, L2s shown in place of the inductors L1, L2 of FIG. 1; the connection to the center port or tap of the spiral inductors L1s, L2s is shown as a dotted line. Note that the spiral inductors L1s, L2s are shown highly stylized as essentially Archimedean spirals; however, such inductors may be of various overall shapes and sizes so long as inductive loops (in the broadest sense) are formed, as is known in the art. For example, U.S. Pat. No. 5,656,849 illustrates spiral inductors with straight sides and right angle turns.

RF circuitry implemented in low-power integrated circuit (IC) technologies ("chips") such as CMOS has enabled increasingly more compact radio systems, such as cell phones and other RF-connected mobile devices. However, while transistors continue to shrink in size as fabrication process technology advances, passive devices such as inductors have not scaled down at the same rate. In particular, on-chip inductors used in RF circuits tend to be the most area-consuming devices, especially since the layout area of IC inductors is not determined by the feature size of an implementing CMOS process but rather upon such factors as the RF carrier frequency, the data rate of the circuit, desired and sufficient inductor Q factor, etc. Further, each inductor often requires long hours of optimization time. Multiband RF front-end circuitry typically uses many inductors to obtain wideband characteristics, resulting in large IC chip (die) sizes and large expenditures of optimization time. Notably, a large IC die size produce smaller yields per semiconductor wafer than smaller IC dies, thus increasing the production cost per die.

Another problem with inductors is that of mutual inductive coupling, in which the flow of current in one inductor (e.g., L1 or L1s) induces a voltage in a nearby inductor (e.g., L2 or L2s), and vice versa. Conventional designs generally try to minimize inductive coupling by physically spacing inductors apart (which often leads to larger IC chip sizes), or by designing the inductors to destructively couple (i.e., have currents flow in opposite directions) to minimize the adverse effects of mutual inductance. In spiral conductors, destructive coupling is generally accomplished by having adjacent inductors wind in opposite directions, as suggested by the winding direction of the spiral inductors L1s and L2s in FIG. 2.

It would be desirable to be able to reduce the size of inductor-based IM matching networks to shrink overall circuit size and reduce production costs, while maintaining high performance and without the adverse effects of mutual inductive coupling as may occur in conventional designs. It would also be desirable in some applications, such as radio frequency power amplifiers, to integrate one or more filter circuits with a tunable impedance matching network. The present invention accomplishes these goals.

SUMMARY OF THE INVENTION

Multi-mode, multi-band integrated circuit RFFE's are commonly used in mobile devices. As a result, impedance matching (IM) networks with multiple inductors can be found in many places in such RFFEs, for example, for antenna and power amplifier impedance matching. Accordingly, it is desirable to shrink the die size, reduce the cost, and simplify the design of IC's embodying such RFFE's while maintaining high performance and without the adverse effects of mutual inductive coupling as may occur in conventional designs. Further, because of the need for such mobile devices to be capable of working at a variety of different frequency bands and modulation schemes, and at low power loss, it is desirable for such RFFE's to be tunable over a wide variety of frequencies and to have low losses.

This disclosure describes a high performance integrated tunable impedance matching network with coupled merged inductors. More particularly, embodiments of the invention include a combination of merged coupled spiral inductors and tunable capacitor elements. This design reduces insertion losses, circuit size, and optimization time while maintaining a high Q factor for the coupled spiral inductors.

One embodiment is a tunable impedance matching network including: a multi-port spiral inductor having an input port and at least two output ports; a first tunable capacitor electrically connected in a shunt configuration from a first one of the at least two output ports of the multi-port spiral inductor to circuit ground; and a second tunable capacitor electrically connected in a shunt configuration from a second one of the at least two output ports of the multi-port spiral inductor to circuit ground.

Another embodiment is a tunable impedance matching network including: a coupled merged inductor having an input port and at least two output ports; a first tunable capacitor electrically connected in a shunt configuration from a first one of the at least two output ports of the coupled merged inductor to circuit ground; and a second tunable capacitor electrically connected in a shunt configuration from a second one of the at least two output ports of the coupled merged inductor to circuit ground.

Yet another embodiment is an integrated circuit tunable impedance matching network for tuning radio frequencies, including: a multi-port spiral inductor having an input port and at least two output ports; a first digitally tunable capacitor electrically connected in a shunt configuration from a first one of the at least two output ports of the multi-port spiral inductor to circuit ground; and a second digitally tunable capacitor electrically connected in a shunt configuration from a second one of the at least two output ports of the multi-port spiral inductor to circuit ground.

Some embodiments of the invention integrate one or more filter circuits with a tunable impedance matching network, useful in conjunction with such applications as radio frequency power amplifiers. The filter circuits may be fixed or tunable, and may be notch filter circuits.

The invention includes various corresponding and associated methods.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Multi-mode, multi-band integrated circuit RFFE's are commonly used in mobile devices. As a result, impedance matching (IM) networks with multiple inductors can be found in many places in such RFFEs, for example, for antenna and power amplifier impedance matching. Accordingly, it is desirable to shrink the die size, reduce the cost, and simplify the design of IC's embodying such RFFE's while maintaining high performance and without the adverse effects of mutual inductive coupling as may occur in conventional designs. Further, because of the need for such mobile devices to be capable of working at a variety of different frequency bands and modulation schemes, and at low power loss, it is desirable for such RFFE's to be tunable over a wide variety of frequencies and to have low losses.

This disclosure describes a high performance integrated tunable impedance matching network with coupled merged inductors. More particularly, embodiments of the invention include a combination of merged coupled spiral inductors and tunable capacitor elements. This design reduces insertion losses, circuit size, and optimization time while maintaining a high Q factor for the coupled spiral inductors.

Figure 3:
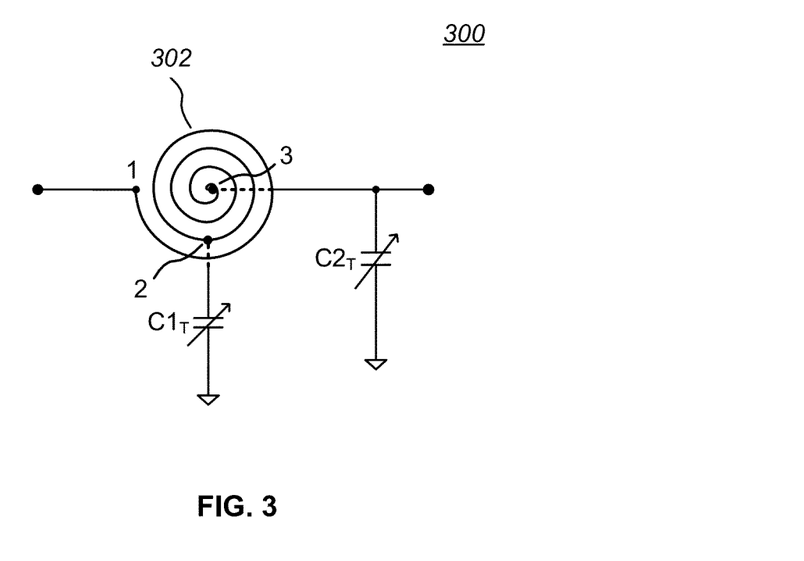
FIG. 3 is schematic diagram showing one embodiment of an impedance matching network in accordance with the present invention.
Figure 4:
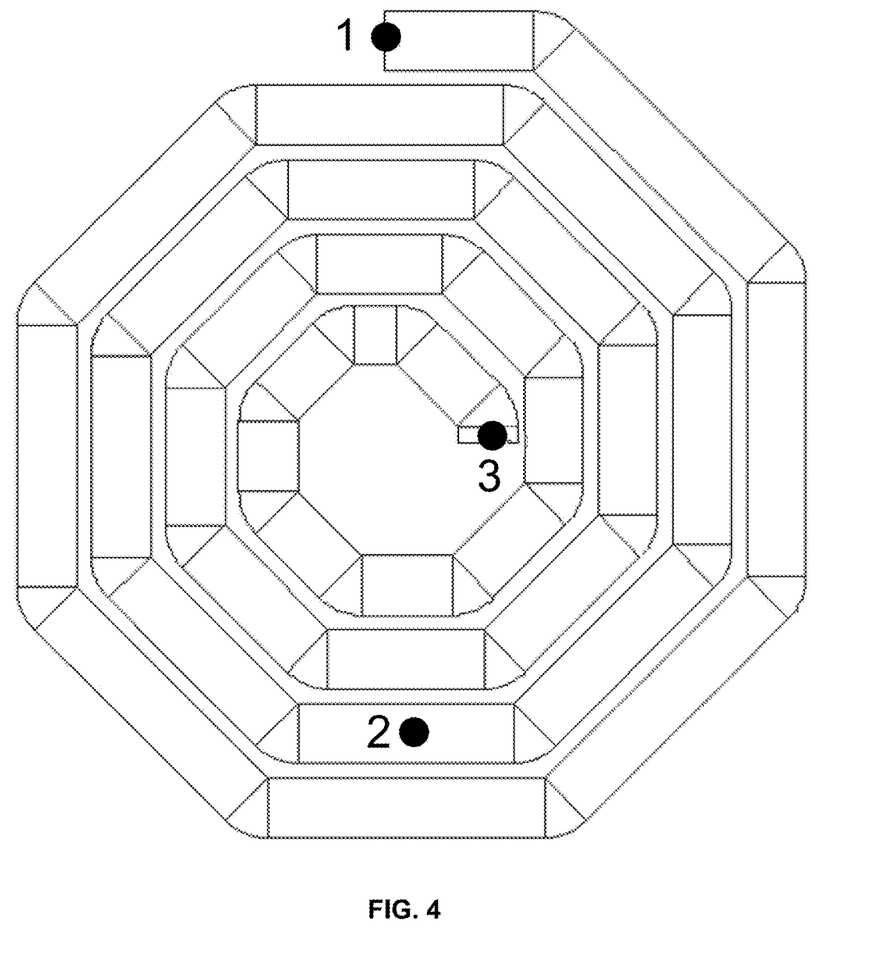
FIG. 4 is a diagram of one spiral inductor structure suitable for fabrication as part of an integrated circuit.

FIG. 3 is schematic diagram showing one embodiment of an impedance matching network 300 in accordance with the present invention. The structure of the IM network 300 is similar to the structure shown in FIG. 2, except that the two separate inductors L1s, L2s in FIG. 2 have been replaced by a single multi-port spiral inductor 302. FIG. 4 is a diagram of one multi-port spiral inductor structure 400 suitable for fabrication as part of an integrated circuit; in the illustrated embodiment, the spiral inductor structure 400 has three ports (1, 2, 3) and can function as two inductors (e.g., L1s'=the inductance from port 1 to port 2, and L2s'=the inductance from port 2 to port 3). Other embodiments may include additional output ports so that the inductor structure 400 may function as more than two inductors. As should be apparent, using a single multi-port spiral inductor 302—effectively comprising "merged" inductors—in place of separate spiral inductors (e.g., L1s, L2s in FIG. 2) generally results in a smaller amount of die space consumption for the total inductor structure.

Referring again to FIG. 3, the IM network 300 includes tunable capacitors $C1_T$, $C2_T$ in addition to the multi-port spiral inductor 302. The tunable capacitors $C1_T$, $C2_T$ are electrically connected in a shunt configuration from respective output ports (2, 3) of the multi-port spiral inductor 302 to circuit ground, as shown. Suitable (and often preferable) tunable capacitors $C1_T$, $C2_T$ are the digitally tunable capacitors (DTCs) taught in U.S. Patent Publication No. 20110002080 A1, filed Mar. 2, 2009, entitled "Method and Apparatus for use in Digitally Tuning a Capacitor in an Integrated Circuit Device", assigned to the assignee of the present application, the contents of which are incorporated in this application by reference as if set forth in full. Using tunable capacitors $C1_T$, $C2_T$ allows tuning of the IM network 300 over a wide range of frequencies.

As should be apparent to one of skill in the art, other components (e.g., resistors, fixed capacitors, inductors) may be coupled or connected to the multi-port spiral inductor 302 and/or to the tunable capacitors $C1_T$, $C2_T$. For example, additional fixed capacitors may be added between various tapping points on the multi-port spiral inductor 302 to create additional shaping of the frequency response (e.g., creating notches at harmonic frequencies or otherwise shaping the frequency response).

Given very limited die space, the mutual coupling effect between conventional inductors is difficult to avoid; with a multi-port spiral inductor, mutual coupling is unavoidable. However, it was discovered that mutual constructive coupling can be an advantage in embodiments of the present invention. In particular, the major advantage is a higher Q factor, which results in a lower insertion loss, as discussed in greater detail below.

Figure 5:
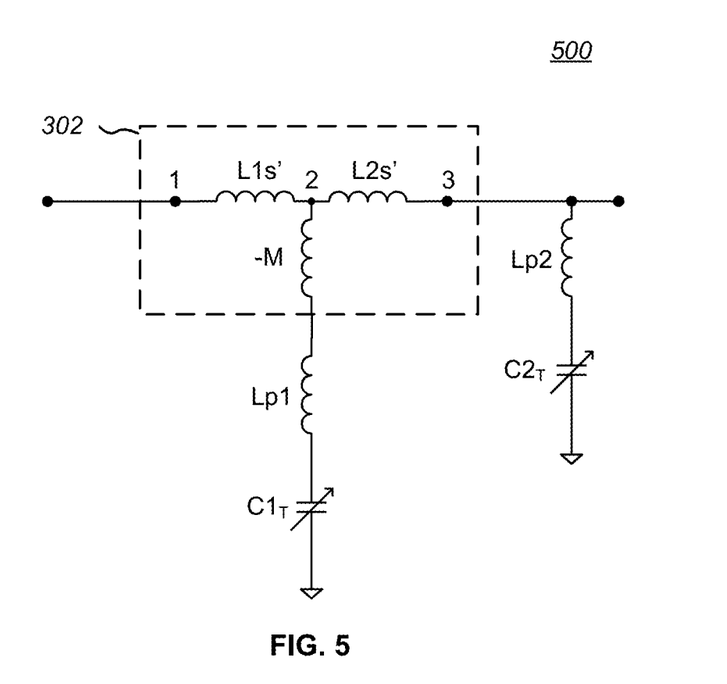
FIG. 5 is a diagram of an equivalent circuit for the IM network embodiment shown in FIG. 3.

FIG. 5 is a diagram of an equivalent circuit 500 for the IM network 300 embodiment shown in FIG. 3. The multi-port spiral inductor 302 is shown modeled as three inductances: $L1s'$ is the inductance from port 1 to port 2 of the multi-port spiral inductor 302; $L2s'$ is the inductance from port 2 to port 3 of the multi-port spiral inductor 302; and $-M$ is a negative mutual inductance created by the mutual constructive interaction of inductors $L1s'$ and $L2s'$.

Also shown in FIG. 5 are the tunable capacitors $C1_T$, $C2_T$ coupled to the multi-port spiral inductor 302. In the equivalent circuit 500, each tunable capacitor $C1_T$, $C2_T$ has an associated parasitic inductance Lp1, Lp2. Such parasitic inductances arise from the self-inductance of the tunable capacitors $C1_T$, $C2_T$ and from interaction of the components and electrical connections of the tunable capacitors $C1_T$, $C2_T$ with nearby components and connections (e.g., flip chip solder bumps). Parasitic inductances are generally detrimental to the performance of conventional circuits and must be minimized for optimum circuit performance (especially for $C1_T$), usually by employing careful layout techniques and minimizing electrical distance between components. However, in embodiments of the present invention, the negative inductance $-M$ of the multi-port spiral inductor 302 equivalent circuit in series with $C1_T$ (which is preferably a DTC) cancels out at least some of the parasitic inductance Lp1 which would otherwise hurt performance of the IM network 300 as a whole. The value of $-M$ can be designed to maintain good impedance coverage compared to conventional designs which use physically separate inductors. Depending on desired circuit parameters and performance criteria, the value of $-M$ can be selected to cancel out the parasitic tunable capacitor inductance Lp1 either completely (i.e., $-M+Lp1\approx 0$) or partially (e.g., such that there is a net negative inductance remaining (i.e., $-M+Lp1<0$), or a net positive inductance remaining (i.e., $-M+Lp1>0$). Utilizing the negative inductance $-M$ of the multi-port spiral inductor 302 equivalent circuit allows the parasitic inductance Lp1 of tunable capacitor $C1_T$ to be reduced or eliminated without unduly constraining the layout and distance between components of the IM network 300 as a whole.

Figure 6A:
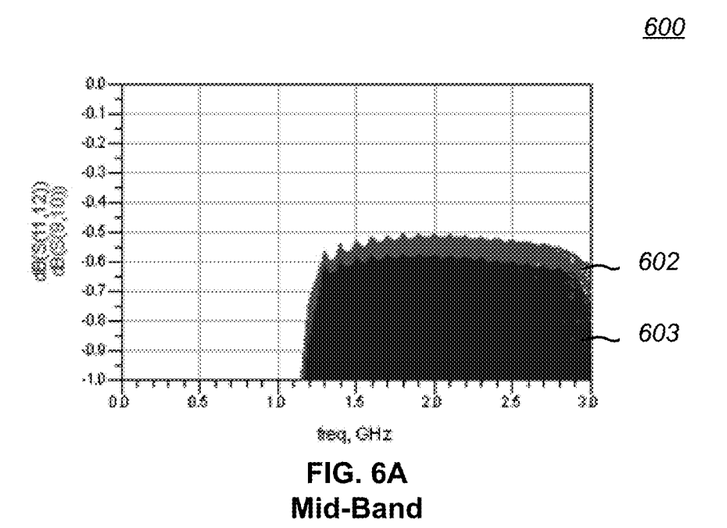
FIG. 6A is a graph showing a plot of insertion loss versus frequency for a mid-band example embodiment of a single multi-port spiral inductor IM network in accordance with the present invention compared to a conventional mid-band dual inductor IM network circuit.
Figure 6B:
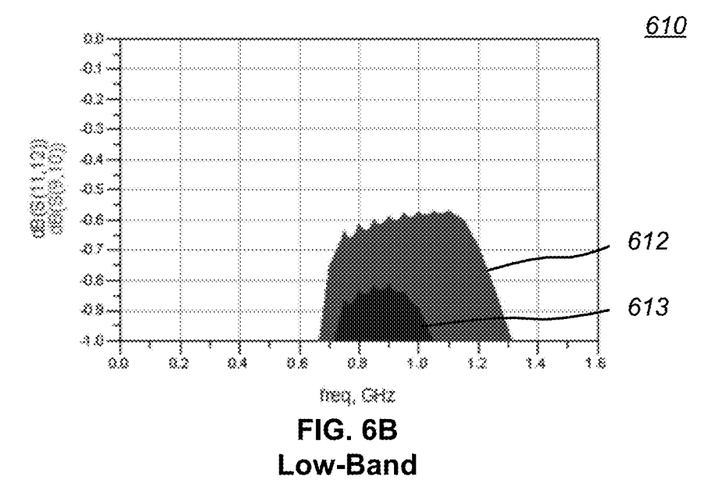
FIG. 6B is a graph showing a plot of insertion loss versus frequency for a low-band example embodiment of a single multi-port spiral inductor IM network in accordance with the present invention compared to a conventional low-band dual inductor IM network circuit.

Further, integrated tunable impedance matching network embodiments using coupled merged inductors exhibit lower insertion loss and wider bandwidths in simulations. For example, FIG. 6A is a graph 600 showing a plot of insertion loss versus frequency for a mid-band example embodiment 602 of a single multi-port spiral inductor IM network 300 in accordance with the present invention compared to a conventional mid-band dual inductor IM network circuit 603. Similarly, FIG. 6B is a graph 610 showing a plot of insertion loss versus frequency for a low-band example embodiment 612 of a single multi-port spiral inductor IM network 300 in accordance with the present invention compared to a conventional low-band dual inductor IM network circuit 613. In both cases, the circuit response was simulated using HFSS, a commercial simulation program from ANSYS, Inc., and the tuning capacitors $C1_T$ and $C2_T$ were assumed to have infinite Q; similar results were achieved using simulation programs from Sonnet Software, Inc. (Sonnet) and from Advanced Design System (MoM).

As the graphs 600, 610 illustrate, the example embodiments 602, 604 of a multi-port spiral inductor IM network 300 exhibited lower insertion losses (IL) in the simulations compared to conventional designs: about 0.1 dB better for the mid-band embodiment and about 0.2 dB better for the low-band embodiment. While seemingly small, these lower IL figures are significant in the context of an RFFE. In addition, the example embodiments 602, 604 exhibited wider bandwidths compared to conventional designs.

Figure 7:
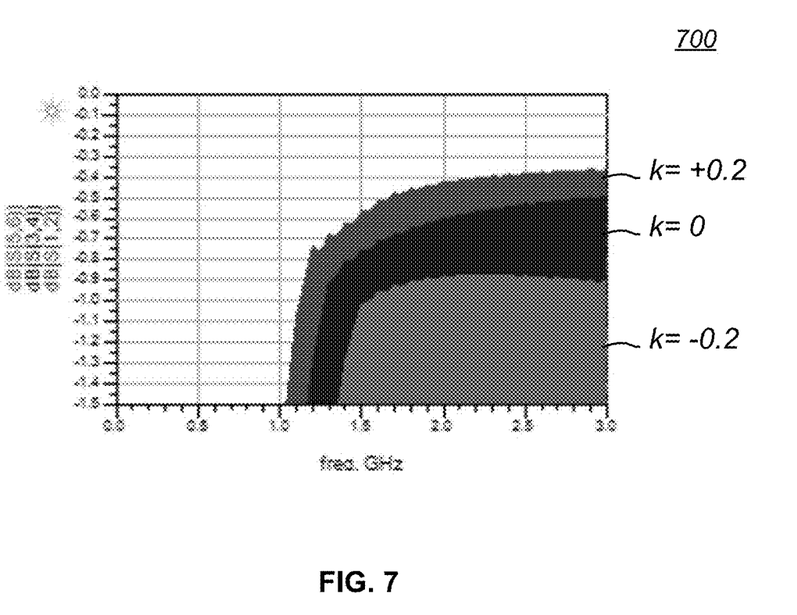
FIG. 7 is a graph showing insertion loss versus frequency for three different coupling coefficients with respect to one simulated embodiment of the invention.

To ensure that the mutual interaction of inductors $L1s'$ and $L2s'$ of the multi-port spiral inductor 302 is constructive, the multi-port spiral inductor 302 should be designed to have a positive coupling coefficient k:

$$k = \frac{M}{\sqrt{L_1 \cdot L_2}} \quad \text{EQ. 1}$$

where $L_1$ and $L_2$ are the self-inductances of two inductors, and M is the mutual or coupling inductance between the same two inductors. It has been shown in simulations that, for the mid-band example embodiment 602 described above, a coupling coefficient $k=+0.2$ exhibits less insertion loss than coefficients of zero or $-0.2$ when all other component parameters are the same. For example, FIG. 7 is a graph 700 showing insertion loss versus frequency for three different coupling coefficients ($k=+0.2$, $k=0$, $k=-0.2$) with respect to one simulated embodiment of the invention. In general, it is expected that positive coupling coefficients will exhibit less insertion loss than non-positive coupling coefficients.

One of the challenges for a tunable integrated IM network is achieving a high Q factor for the inductors. In particular, it is important to design a multi-port spiral inductor 302 to have a high Q factor. For the equivalent circuit 500 of the IM network shown in FIG. 5, $$Q_{1,2} = \frac{jw(L_{1,2} + M)}{R_{1,2}} \quad \text{EQ. 2}$$

where $L_{1,2}$ is the self-inductance of the $L1s'$ and $L2s'$ branches of the spiral inductor 302, M is the mutual inductance of $L1s'$ and $L2s'$, and $R_{1,2}$ is the effective series resistance of the $L1s'$ and $L2s'$ branches, respectively.

The inductive characteristics of a multi-port spiral inductor 302 can be controlled through the spacing of its windings and the diameter of its loops. Narrower spacing increases coupling, provides higher Q, and saves die area; larger loops result in higher Q. Use of precision IC manufacturing techniques provides tight control over both of these design aspects. However, the exact determination of these parameters is design dependent, since numerous other factors (e.g., adjacent circuitry, target frequency bands, fabrication process, power levels, etc.) may affect particular multi-port spiral inductor designs.

Another aspect of the invention includes a method for configuring a tunable impedance matching network, including:
- providing a coupled merged inductor (e.g., a multi-port spiral inductor) having an input port and at least two output ports;
- coupling a first tunable capacitor electrically connected in a shunt configuration from a first one of the at least two output ports of the coupled merged inductor to circuit ground; and
- coupling a second tunable capacitor electrically connected in a shunt configuration from a second one of the at least two output ports of the coupled merged inductor to circuit ground The described method can be extended to include manufacturing the tunable impedance matching network as an integrated circuit, using digitally tunable capacitors for one or both of the first tunable capacitor and the second tunable capacitor, limiting the coupled merged inductor to only two output ports, and configuring the tunable impedance matching network for tuning radio frequencies.

Benefits of an integrated tunable impedance matching network using coupled merged inductors include: (1) a reduction in IC die area due to merging inductors in a multiport-spiral topology; (2) a general reduction in the required total inductance value (from taking advantage of mutual constructive inductance) to achieve the same Smith chart coverage; (3) lower insertion losses; and (4) wider bandwidth. Applications of such an integrated tunable IM network include: tunable output matching networks for power amplifiers; tunable input matching networks (IMN) for antenna tuning; an integrated inductor for a low noise amplifiers (LNAs); and a tunable filter using coupled integrated inductors.

As should be apparent to one of skill in the art, other components (e.g., resistors, additional capacitors and inductors, active devices, etc.) may be coupled or connected to the various circuit elements of embodiments of the impedance matching network described above to meet particular design needs.

Integrated Filter Embodiments

As noted above, one application of an integrated tunable impedance (IM) matching in accordance with the present invention includes use as a tunable output matching network (OMN) for power amplifiers. Power amplifiers (PAs) are one of the most complicated circuit blocks within an RF front end (RFFE) to design (as noted above, "RFFE" is a generic term for all of the circuitry between a radio antenna up to and including the mixer stage of a radio). One of the challenges in designing an RFFE is handling high harmonic distortion and receiver noise which is generated or leaked from PA output waveforms. The problem of receiver noise induced by PA output increases as the number of bands increase. For many applications, such as multi-mode multi-band mobile devices (e.g., cellular telephones), these problems must be overcome with acceptable IC size, power consumption, and cost.

One common solution is to first match the output impedance of a PA (typically less than 25 ohms, and often less than 5 ohms) to the characteristic impedance of the system (50 ohms for modern RF circuits), and then include filters for each receiver band to remove distortion. However, this solution requires a large number of components for the multiple filters and extensive engineering effort to tune the filters, taking into account inter-filter interactions. Extra components generally mean a larger IC die size and higher power consumption, and hence increased cost.

The present invention solves these problems of PA design by merging both the impedance matching and the filtering functions into a single tunable and integrated IM and filter circuit. Using this approach, impedance matching a PA at the transmission (Tx) band and filtering distortions at harmonics of the PA output and/or at receiver (Rx) frequency bands can be done simultaneously. Accordingly, filtering does not necessarily need to be done in the characteristic impedance environment (e.g., at 50 ohms). Removing this design constraint of conventional circuits allows tremendous design flexibilities and benefits. For example, in a conventional 50-ohm system, creating attenuation at Tx operational frequency harmonics and filtering multiple Rx frequency bands with realizable component values in an IC typically results in high insertion losses at the Tx operational frequencies. However, within an IM network designed to match the typically lower PA output impedance to 50 ohms, one or more filters (generally notch filters) can be deployed virtually anywhere within the IM network for optimized impedance matching and filtering performances, with minimal insertion loss degradation compared to conventional PA output impedance matching only at Tx operational frequencies.

Figure 8:
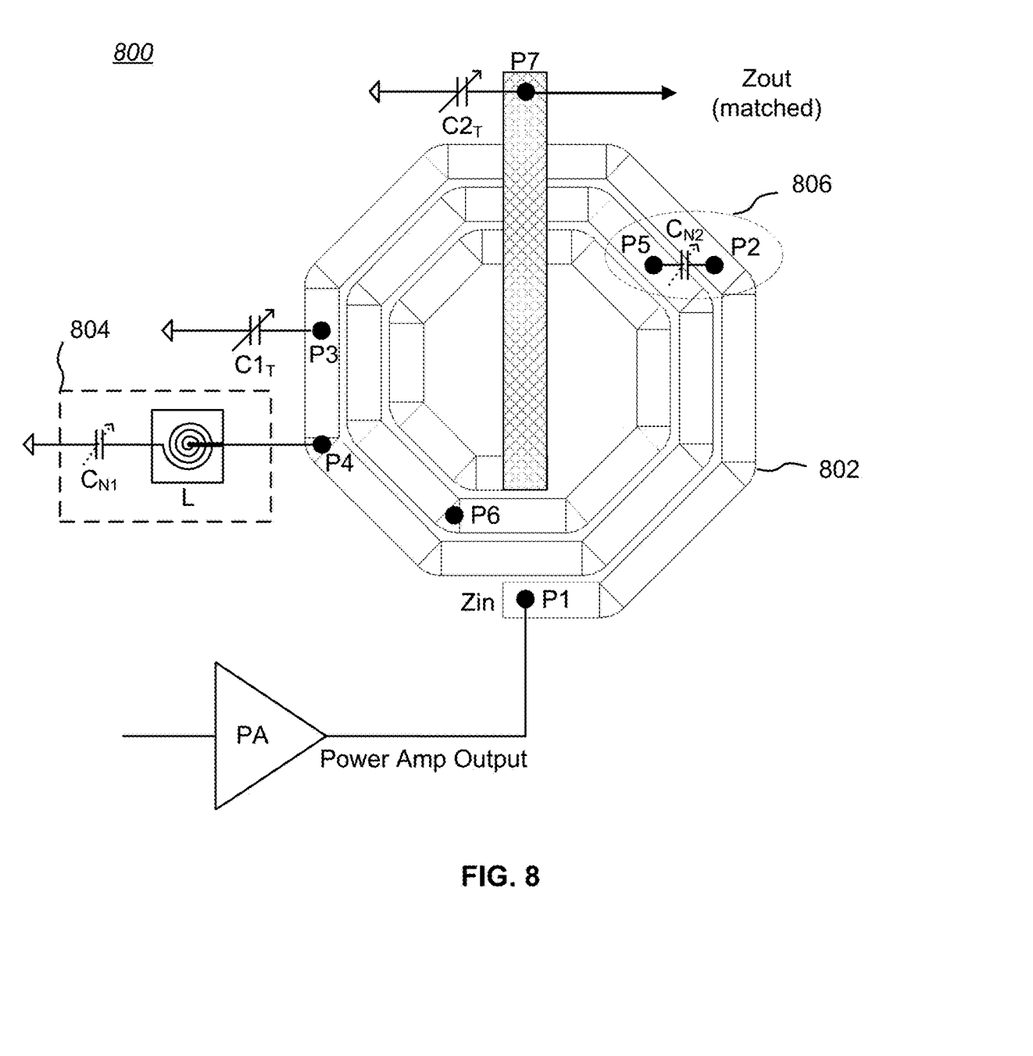
FIG. 8 is a diagram of a one embodiment of a tunable and integrated IM and filter (IMF) circuit that includes a spiral inductor structure having integrated filter circuits and suitable for fabrication as part of an integrated circuit.

FIG. 8 is a diagram of a one embodiment of a tunable and integrated IM and filter (IMF) circuit 800 that includes a spiral inductor structure having integrated filter circuits and suitable for fabrication as part of an integrated circuit. The IMF circuit 800 is similar to the circuit shown in FIG. 3, and is based on a spiral inductor structure 802 similar to that shown in FIG. 4. In the illustrated example, the spiral inductor structure 802 has seven ports P1-P7 and can function as multiple inductor elements (e.g., from P1 to P2 and from P5 to P7). Other embodiments may include fewer or more ports; for example, port P6 is an "extra" port that may be used for another circuit connection (e.g., a filter) or disregarded or omitted entirely. As should be apparent, using a single multi-port spiral inductor 802—effectively comprising "merged" inductors—in place of separate spiral inductors generally results in a smaller amount of die space consumption for the total inductor structure.

The IMF circuit 800 further includes one or more tunable capacitors $C1_T$, $C2_T$; two are shown by way of example only. The tunable capacitors $C1_T$, $C2_T$ are electrically connected in a shunt configuration from respective ports (P3 and P7 in this example) of the spiral inductor 802 to circuit ground, and enable tunable impedance matching as described above with respect to FIG. 3 and FIG. 5. Suitable (and often preferable) tunable capacitors $C1_T$, $C2_T$ are the digitally tunable capacitors (DTCs) taught in U.S. Patent Publication No. 20110002080 A1, referenced above. Using tunable capacitors $C1_T$, $C2_T$ allows tuning of the IMF circuit 800 over a wide range of frequencies. However, in some applications, one or more of the capacitors may be fixed.

In addition to the tunable capacitors $C1_T$, $C2_T$, the IMF circuit 800 includes one or more series or parallel filters connected to one more of the ports of the IMF circuit 800. In preferred embodiments, the series or parallel filters are notch filters configured to filter out unwanted harmonics or Rx frequencies from the output of a coupled power amplifier PA.

In the example illustrated in FIG. 8, a notch filter 804 is coupled in series between port P4 and circuit ground. The notch filter 804 in this example comprises a simple LC circuit that includes a capacitor $C_{N1}$ and an inductor L connected in series. As illustrated, the inductor L is another spiral inductor (although not necessarily a multi-port spiral inductor), although other implementations of an inductive element may be used (e.g., a transmission line). The capacitor $C_{N1}$ may be tunable or fixed, depending on the application (the dotted arrow indicates that tunability is optional). More complex or different series notch filter circuits may be used if desired, for sharper and/or broader notch filtering characteristics. For example, variable length transmission lines and/or selectable sets of transmission lines may be utilized in a series notch filter circuit configuration. Multiple series notch filters 804 may be used, each coupled to a different port of the IMF circuit 800. Further, more than one series notch filter 804 may be connected to the same port of the IMF circuit 800, with a switching network (not shown) used to select an operational filter and to isolate non-operational filters.

In the example of FIG. 8, a parallel notch filter 806 is coupled between port P2 and port P5. The parallel notch filter 806 comprises an LC circuit that includes a capacitor $C_{N2}$ coupled in parallel with the inductor segment of the IMF circuit 800 from P2 to P5. The capacitor $C_{N2}$ may be tunable or fixed, depending on the application (the dotted arrow indicates that tunability is optional). Again, more complex or different series notch filter circuits may be used if desired, for sharper and/or broader notch filtering characteristics. For example, variable length transmission lines and/or selectable sets of transmission lines may be utilized in a parallel notch filter circuit configuration. Multiple parallel notch filters 806 may be used, each coupled to a different pair of ports of the IMF circuit 800. Further, more than one capacitor may be connected between the same pairs of ports of the IMF circuit 800, with a switching network (not shown) used to select one or more operational capacitors and to isolate non-operational capacitors.

Figure 9:
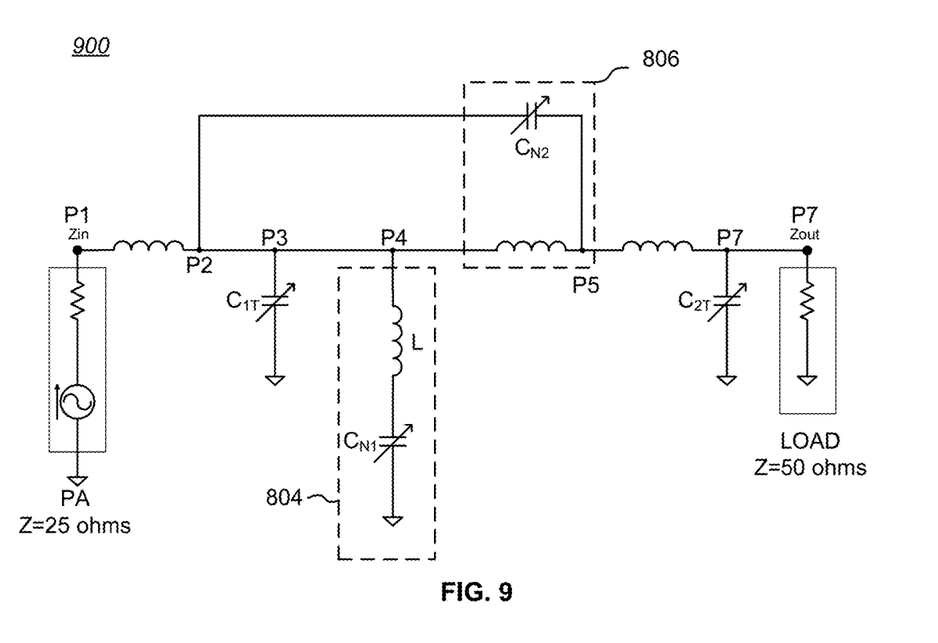
FIG. 9 is an equivalent circuit diagram of the IMF circuit shown in FIG. 8.

FIG. 9 is an equivalent circuit diagram 900 of the IMF circuit 800 shown in FIG. 8 (note that not all ports and inductor segments of the IMF circuit 800 are represented). In this example, the power amplifier PA coupled to port P1 (i.e., Zin) of the IMF circuit 800 has an output impedance of 25 ohms, and is impedance matched at port P7 (i.e., Zout) of the IMF circuit 800 to the 50 ohm characteristic impedance of a coupled LOAD. The output of the power amplifier PA coupled to port P1 of the IMF circuit 800 is filtered by the one or more notch filters 804, 806 and impedance matched by the tunable capacitors $C1_T$, $C2_T$. As should be apparent to one of skill in the art, other components (e.g., resistors, fixed capacitors, inductors) may be coupled or connected to the IMF circuit 800. Of note, care should be taken in the selection of the locations of the ports Pn and component values to ensure minimal or tolerable interference between impedance matching and filtering circuit elements.

Figure 10A:
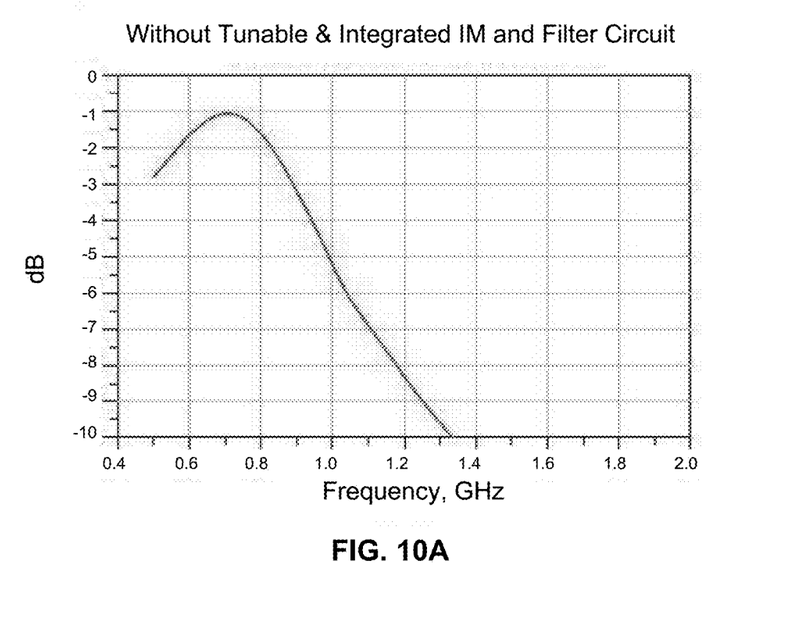
FIG. 10A is a graph of frequency (in GHz) versus attenuation (in dB) for a signal from a power amplifier without using an IMF circuit.
Figure 10B:
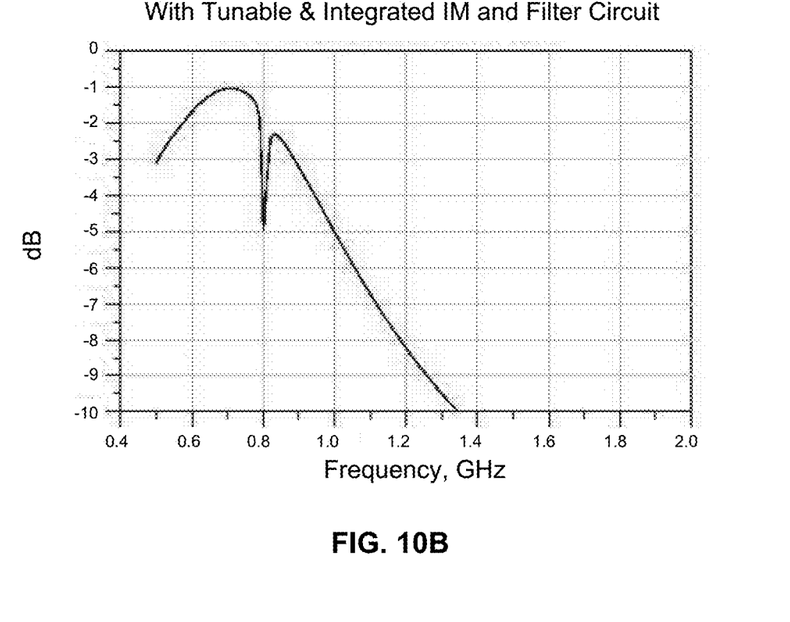
FIG. 10B is a graph of frequency (in GHz) versus attenuation (in dB) for a signal from a power amplifier while using a particular IMF circuit.

FIG. 10A is a graph of frequency (in GHz) versus attenuation (in dB) for a signal from a power amplifier without using an IMF circuit 800. FIG. 10B is a graph of frequency (in GHz) versus attenuation (in dB) for a signal from a power amplifier while using a particular IMF circuit 800. As a comparison of the graphs shows, the particular embodiment of an IMF circuit 800 provides a significant attenuation of the PA output at a selected Rx band around about 0.8 GHz.

Tuning of the tunable elements of the IMF circuit 800 is by control circuitry (not shown) configured to receive control words directly from an external source to set the IMF circuit 800 to a selected impedance tuning and filtering state (e.g., based on a band combination selected by a user or other circuitry) by means of a digital interface, or control words may be indirectly supplied from a look-up table (i.e., implemented as fuses, PROM, EEPROM, etc.) containing tuning and filtering states for various RF band combinations or from various control signals processed through combinatorial circuitry. Thus, program control of the IMF circuit 800 can be based on a user selection or external (to the IMF circuit 800) control signals, or be automatically set in response to detected system states or parameters (e.g., PA state, lookup values, detected signal frequency, signal strength, power consumption, IC device temperature, etc.).

Circuit simulations and measured results from actual IC implementations of an embodiment of the IMF circuit 800 show improvement in insertion loss, IC die area savings, and less design time for optimizing the various inductive elements compared to a conventional design. Measured results show the IMF circuit 800 performs as well or better than a conventional design with respect to impedance matching the circuit fundamental frequency $f_0$, and better than a convention al design with respect to filtering the second harmonic frequency $2f_0$. The filtering frequencies have a very wide range, allowing selective rejection of harmonic or Rx frequencies as desired.

Thus, by physically and functionally merging both impedance matching and the filtering functions into a single tunable and integrated IM and filter circuit, the IMF circuit 800 results in improved insertion loss, a smaller IC die size, lower power consumption, and faster design time, and hence improved performance at a reduced cost.

Another aspect of the invention is a method for configuring a tunable impedance matching and filtering circuit, including:
  providing a coupled merged inductor having at least three ports, at least one such port configured to receive an input signal and at least one other such port configured to output a filtered impedance matched output signal;
  coupling a first tuning circuit electrically to a first one of the at least three ports of the coupled merged inductor;
  coupling a second tuning circuit electrically to a second one of the at least three ports of the coupled merged inductor; and
  coupling at least one filter circuit to one or more of the at least three ports of the coupled merged inductor.

The above method can be extended to include to manufacturing the tunable impedance matching and filtering circuit as an integrated circuit; using digitally tunable capacitors (DTCs) for one or both of the first tuning circuit and the second tuning circuit; using serial and/or parallel filter circuits, which may be notch filters and may use DTCs; configuring the tunable impedance matching and filtering circuit for tuning and filtering radio frequencies; and using a coupled merged inductor with a positive coupling coefficient.

Uses & Fabrication

Integrated tunable impedance matching network circuits in accordance with the present invention, optionally with integrated filters, are useful in a wide variety of applications, including radar systems (including phased array and automotive radar systems) and radio systems. Radio system usage includes (again, without limitation) cellular radios systems (including base stations, relay stations, and handheld transceivers) that use such standards as Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about one GHz, and particularly above about 2 GHz). Monolithic IC implementation is particularly useful since parasitic capacitances generally can be kept low (or at a minimum, kept uniform across all units, permitting them to be compensated) by careful design.

A number of embodiments of the invention have been described. It is to be understood that various modifications may be made without departing from the spirit and scope of the invention. For example, some of the steps described above may be order independent, and thus can be performed in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A combined tunable impedance matching and filtering circuit including:
   (a) a coupled merged inductor having at least three ports, including an input port configured to receive an input signal and having a first characteristic impedance, an output port configured to output a filtered impedance matched output signal and having a second characteristic impedance, and at least one internal port situated between the input port and the output port, wherein the at least one internal port has a corresponding characteristic impedance;
   (b) a plurality of tuning circuits, each electrically connected to a corresponding one of the at least three ports of the coupled merged inductor; and
   (c) at least one filter circuit, each configured as a notch filter electrically connected to at least one internal port of the coupled merged inductor and comprising circuit components distinct from the plurality of tuning circuits, configured to filter selected radio frequencies at the corresponding characteristic impedance of the at least one internal port.

2. The invention of claim 1, wherein at least one filter circuit is a series filter circuit connected between a corresponding internal port and circuit ground.

3. The invention of claim 2, wherein the series filter circuit includes a digitally tunable capacitor.

4. The invention of claim 1, wherein at least one filter circuit is a parallel filter circuit connected between two corresponding ports.

5. The invention of claim 4, wherein the parallel filter circuit includes a digitally tunable capacitor.

6. The invention of claim 1, wherein at least one of the tuning circuits includes a digitally tunable capacitor.

7. The invention of claim 1, wherein the tunable impedance matching and filtering circuit is configured for tuning and filtering radio frequencies.

8. The invention of claim 1, wherein the coupled merged inductor has a positive coupling coefficient.

9. The invention of claim 1, wherein the tunable impedance matching and filtering circuit is manufactured as an integrated circuit.

10. A combined tunable impedance matching and filtering network including:
    (a) a multi-port spiral inductor having at least three ports, including an input port configured to receive an input signal and having a first characteristic impedance, an output port configured to output a filtered impedance matched output signal and having a second characteristic impedance, and at least one internal port situated between the input port and the output port, wherein the at least one internal port has a corresponding characteristic impedance;
    (b) a first tunable capacitor electrically connected in a shunt configuration from a first one of the at least three ports of the multi-port spiral inductor to circuit ground;
    (c) a second tunable capacitor electrically connected in a shunt configuration from a second one of the at least three ports of the multi-port spiral inductor to circuit ground; and
    (d) at least one filter circuit, each configured as a notch filter electrically connected to at least one internal port of the multi-port spiral inductor and comprising circuit components distinct from the first and second tunable capacitors, configured to filter selected radio frequencies at the corresponding characteristic impedance of the at least one internal port.

11. The invention of claim 10, wherein at least one filter circuit is a series filter circuit connected between a corresponding internal port and circuit ground.

12. The invention of claim 11, wherein the series filter circuit includes a digitally tunable capacitor.

13. The invention of claim 10, wherein at least one filter circuit is a parallel filter circuit connected between two corresponding ports.

14. The invention of claim 13, wherein the parallel filter circuit includes a digitally tunable capacitor.

15. The invention of claim 10, wherein at least one of the first tunable capacitor and the second tunable capacitor is a digitally tunable capacitor.

16. The invention of claim 10, wherein the tunable impedance matching and filtering network is configured for tuning and filtering radio frequencies.

17. The invention of claim 10, wherein the multi-port spiral inductor has a positive coupling coefficient.

18. The invention of claim 10, wherein the tunable impedance matching and filtering network is manufactured as an integrated circuit.

19. An integrated circuit tunable impedance matching and combined filter network for tuning and filtering radio frequencies, including:
    (a) a multi-port spiral inductor having at least three ports, including an input port to receive an input signal and having a first characteristic impedance, an output port configured to output a filtered impedance matched output signal and having a second characteristic impedance, and at least one internal port situated between the input port and the output port, wherein the at least one internal port has a corresponding characteristic impedance;

(b) a first digitally tunable capacitor electrically connected in a shunt configuration from a first one of the at least three ports of the multi-port spiral inductor to circuit ground;

(c) a second digitally tunable capacitor electrically connected in a shunt configuration from a second one of the at least three ports of the multi-port spiral inductor to circuit ground; and (d) at least one notch filter circuit, each electrically connected to at least one internal port of the multi-port spiral inductor and comprising circuit components distinct from the first and second digitally tunable capacitors;

wherein the first and second digitally tunable capacitors are configured to impedance match the received input signal to the output signal, and each notch filter circuit is configured to filter selected radio frequencies out of the output signal at the corresponding characteristic impedance of the at least one internal port.

20. A method for configuring a combined tunable impedance matching and filtering circuit, including:

(a) providing a coupled merged inductor having at least three ports, including an input port configured to receive an input signal and having a first characteristic impedance; an output port configured to output a filtered impedance matched output signal and having a second characteristic impedance, and at least one internal port situated between the input port and the output port, wherein the at least one internal port has a corresponding characteristic impedance;

(b) coupling each of a plurality of tuning circuits to a corresponding one of the at least three ports of the coupled merged inductor; and (c) coupling at least one filter circuit to at least one internal port of the coupled merged inductor, wherein each filter circuit comprises a notch filter having circuit components distinct from the plurality of tuning circuits and is configured to filter selected radio frequencies at the corresponding characteristic impedance of the at least one internal port.

21. The method of claim 20, wherein at least one filter circuit is a series filter circuit connected between a corresponding internal port and circuit ground.

22. The method of claim 21, wherein the series filter circuit includes a digitally tunable capacitor.

23. The method of claim 20, wherein at least one filter circuit is a parallel filter circuit connected between two corresponding ports.

24. The method of claim 23, wherein the parallel filter circuit includes a digitally tunable capacitor.

25. The method of claim 20, wherein at least one of the tuning circuits is a digitally tunable capacitor.

26. The method of claim 20, further including configuring the tunable impedance matching and filtering circuit for tuning and filtering radio frequencies.

27. The method of claim 20, wherein the coupled merged inductor has a positive coupling coefficient.

28. The method of claim 20, further including manufacturing the tunable impedance matching and filtering circuit as an integrated circuit.

29. A method for configuring a combined tunable impedance matching and filtering network, including:

(a) providing a multi-port spiral inductor having at least three ports, including an input port configured to receive an input signal and having a first characteristic impedance, an output port configured to output a filtered impedance matched output signal and having a second characteristic impedance, and at least one internal port situated between the input port and the output port, wherein the at least one internal port has a corresponding characteristic impedance;

(b) coupling a first tunable capacitor electrically in a shunt configuration from a first one of the at least three ports of the multi-port spiral inductor to circuit ground;

(c) coupling a second tunable capacitor electrically in a shunt configuration from a second one of the at least three ports of the multi-port spiral inductor to circuit ground; and (d) coupling at least one filter circuit to at least one internal port of the multi-port spiral inductor, wherein the at least one filter circuit comprises a notch filter having circuit components distinct from the first and second tunable capacitors and is configured to filter selected radio frequencies at the corresponding characteristic impedance of the at least one internal port.

30. The method of claim 29, wherein at least one filter circuit is a series filter circuit connected between a corresponding internal port and circuit ground.

31. The method of claim 30, wherein the series filter circuit includes a digitally tunable capacitor.

32. The method of claim 29, wherein at least one filter circuit is a parallel filter circuit connected between two corresponding ports.

33. The method of claim 32, wherein the parallel filter circuit includes a digitally tunable capacitor.

34. The method of claim 29, wherein at least one of the first tunable capacitor and the second tunable capacitor is a digitally tunable capacitor.

35. The method of claim 29, further including configuring the tunable impedance matching and filtering network for tuning and filtering radio frequencies.

36. The method of claim 29, wherein the multi-port spiral inductor has a positive coupling coefficient.

37. The method of claim 29, further including manufacturing the tunable impedance matching and filtering network as an integrated circuit.

38. A method for configuring an integrated circuit tunable impedance matching and combined filtering network for tuning and filtering radio frequencies, including:

(a) providing a multi-port spiral inductor having at least three ports, including an input port configured to receive an input signal and having a first characteristic impedance, an output port configured to output a filtered impedance matched output signal and having a second characteristic impedance, and at least one internal port situated between the input port and the output port, wherein each at least one internal port has a corresponding characteristic impedance;

(b) coupling a first digitally tunable capacitor electrically in a shunt configuration from a first one of the at least three ports of the multi-port spiral inductor to circuit ground;

(c) coupling a second digitally tunable capacitor electrically in a shunt configuration from a second one of the at least three ports of the multi-port spiral inductor to circuit ground;

(d) coupling at least one notch filter circuit to at least one internal port of the multi-port spiral inductor, each notch filter circuit comprising circuit components distinct from the first and second digitally tunable capacitors;

(e) configuring the first and second digitally tunable capacitors to impedance match the received input signal to the output signal; and
(f) configuring each notch filter circuit to filter selected radio frequencies out of the output signal at the corresponding characteristic impedance of the at least one internal port.

* * * * *